United States Patent
Dube et al.

(10) Patent No.: US 8,546,204 B2
(45) Date of Patent: Oct. 1, 2013

(54) METHOD FOR GROWING CONFORMAL EPI LAYERS AND STRUCTURE THEREOF

(75) Inventors: Abhishek Dube, Hopewell Junction, NY (US); Jophy Stephen Koshy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 13/251,315

(22) Filed: Oct. 3, 2011

(65) Prior Publication Data
US 2013/0082275 A1 Apr. 4, 2013

(51) Int. Cl.
*H01L 21/338* (2006.01)
*H01L 21/8238* (2006.01)
*H01L 21/336* (2006.01)

(52) U.S. Cl.
USPC ........... 438/163; 438/230; 438/294; 438/300; 257/E29.266; 257/E29.278

(58) Field of Classification Search
None
See application file for complete search history.

(56) References Cited

U.S. PATENT DOCUMENTS

| | | | |
|---|---|---|---|
| 3,544,863 A * | 12/1970 | Price et al. | 257/532 |
| 4,948,456 A | 8/1990 | Schubert | |
| 5,612,242 A | 3/1997 | Hsu | |
| 5,989,978 A | 11/1999 | Peidous | |
| 6,764,958 B1 | 7/2004 | Nemani et al. | |
| 7,348,248 B2 | 3/2008 | Cheng | |
| 7,482,656 B2 | 1/2009 | Luo et al. | |
| 7,759,213 B2 | 7/2010 | Dube et al. | |
| 2007/0048966 A1 | 3/2007 | Chau et al. | |
| 2009/0075029 A1* | 3/2009 | Thomas et al. | 428/173 |
| 2009/0134470 A1* | 5/2009 | Yang | 257/369 |
| 2009/0152599 A1 | 6/2009 | Gao et al. | |
| 2010/0224938 A1* | 9/2010 | Zhu | 257/369 |
| 2011/0108894 A1* | 5/2011 | Sung et al. | 257/288 |

OTHER PUBLICATIONS

B. J. Ginsberg et al.; New Method for Fabricating Silicon-On-Insulator Structures Using Selective Epitaxial Lateral Growth; IBM Technical Disclosure Bulletin; vol. 33. No. 6b, pp. 387-389.
W. Faschinger et al.; Electrical properties of Si1–xCx alloys and modulation doped Si/Si1–xCx/Si structures; Appl. Phys. Lett.; vol. 67,1995.114409, 3 pages.
Pending U.S. Appl. No. 13/004,201, entitled "Process for Epitaxially Growing Epitaxial Material Regions", filed Jan. 10, 2011.

* cited by examiner

*Primary Examiner* — Julio J Maldonado
*Assistant Examiner* — Harpreet Singh
(74) *Attorney, Agent, or Firm* — Howard M. Cohn; Katherine S. Brown

(57) ABSTRACT

A method for forming a conformal buffer layer of uniform thickness and a resulting semiconductor structure are disclosed. The conformal buffer layer is used to protect highly-doped extension regions during formation of an epitaxial layer that is used for inducing mechanical stress on the channel region of transistors.

10 Claims, 9 Drawing Sheets

_US 8,546,204 B2_

METHOD FOR GROWING CONFORMAL EPI LAYERS AND STRUCTURE THEREOF

FIELD OF THE INVENTION

The present invention relates to the manufacture of integrated circuit devices, and more specifically, to the formation of epitaxial material regions within transistor integrated circuits.

BACKGROUND OF THE INVENTION

Modern integrated circuit devices utilize various solid-state elements such as transistors. Generally, transistors (such as field effect transistors (FET)) include a semiconductor channel region between conductive source and drain regions. The semiconductor channel region in an FET is changed from a non-conducting state to a conducting state based on the presence of a voltage field generated by the gate conductor. Similarly, diodes utilize semiconductor regions to control current flow between the anode and the cathode and, in the same way, bipolar junction transistors control current flow based upon the semiconductor nature of the collector, emitter, and base.

Integrated circuit technology may involve the use of epitaxial silicon carbon source/drain regions adjacent the semiconductor channel regions in N-type field effect transistors. Due to the lattice mismatch between silicon and diamond lattice, epitaxial silicon carbon material in the source drain region imparts a tensile strain to the channel which leads to enhanced electron mobility and N-type transistor drive current. A similar approach in the case of P-type field effect transistors is adopted by using epitaxial silicon germanium in the source drain regions to induce a compressive strain in the channel region which leads to enhancement on hole mobility and P-type transistor drive current. It is therefore desirable to have improved methods and structures for utilizing such epitaxial material regions.

SUMMARY

In one embodiment, a method of forming a buffer layer in a region between two adjacent transistors on a silicon substrate is provided. The method comprises etching a first opening in the silicon substrate in the region between adjacent transistors, depositing a buffer layer into the first opening, forming a set of spacers on the two adjacent transistors, such that the set of spacers partially covers the buffer layer, etching a second opening into the buffer layer; and filling the second opening with an epitaxial layer.

In another embodiment, a method of forming a buffer layer in a region between two adjacent transistors on a silicon substrate is provided. The method comprises etching a first opening partially through the silicon substrate in the region between adjacent transistors, depositing a buffer layer into the first opening, forming spacers on the two adjacent transistors, such that the spacers partially covers the buffer layer, etching a second opening into the buffer layer. The second opening traverses the buffer layer and the silicon substrate. The second opening is then filled with an epitaxial layer.

In another embodiment, a semiconductor structure is provided. The semiconductor structure comprises a first transistor and a second transistor disposed on a silicon substrate. The first transistor and second transistor each comprise an extension region formed within the silicon substrate. The semiconductor structure further comprises an opening in the silicon substrate between the first transistor and second transistor, a conformal buffer layer of uniform thickness disposed within the opening, and covering a side of each extension region, and an epitaxial layer formed within the opening, and in contact with the buffer layer.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGS.) of the drawing, in which case typically the last two significant digits may be the same, the most significant digit being the number of the drawing figure (FIG.).

FIG. 1 shows a prior art semiconductor structure.

FIG. 2 shows a semiconductor structure after a process step of depositing a buffer layer.

FIG. 3 shows a semiconductor structure after a process step of forming an additional set of spacers.

FIG. 4 shows a semiconductor structure after a process step of forming an opening in the buffer layer.

FIG. 5 shows a semiconductor structure after a process step of growing an epitaxial layer.

FIG. 6 shows a semiconductor structure after a process step for another embodiment of the present invention, of depositing a buffer layer.

FIG. 7 shows the semiconductor structure of FIG. 6, after a process step of forming an additional set of spacers.

FIG. 8 shows the semiconductor structure of FIG. 7, after a process step of forming an opening in the buffer layer.

FIG. 9 shows the semiconductor structure of FIG. 8, after a process step of growing an epitaxial layer.

FIG. 10A shows a semiconductor structure after a process step for another embodiment of the present invention of forming an opening partially through a silicon layer.

FIG. 10B shows the semiconductor structure of FIG. 10A after a process step of depositing a buffer layer.

Figure 10A:
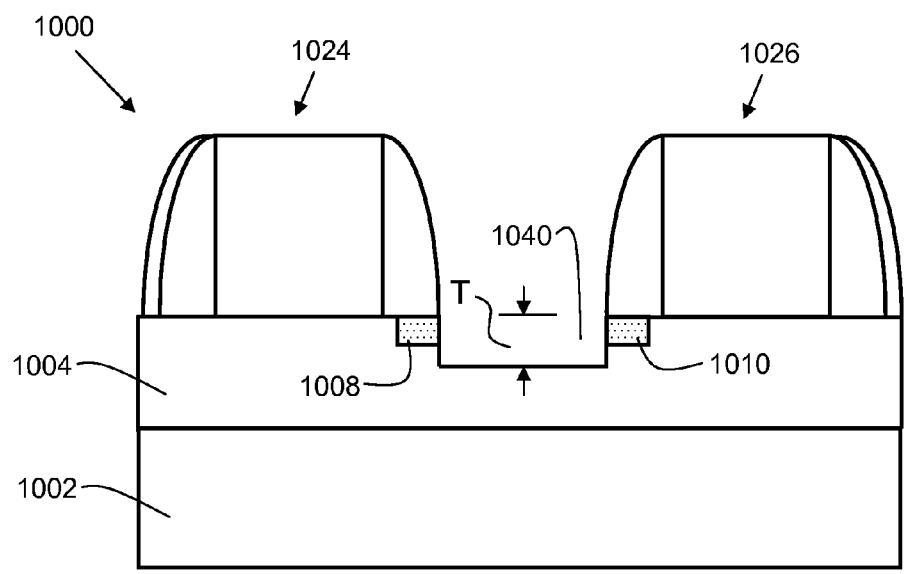
Figure 10B:
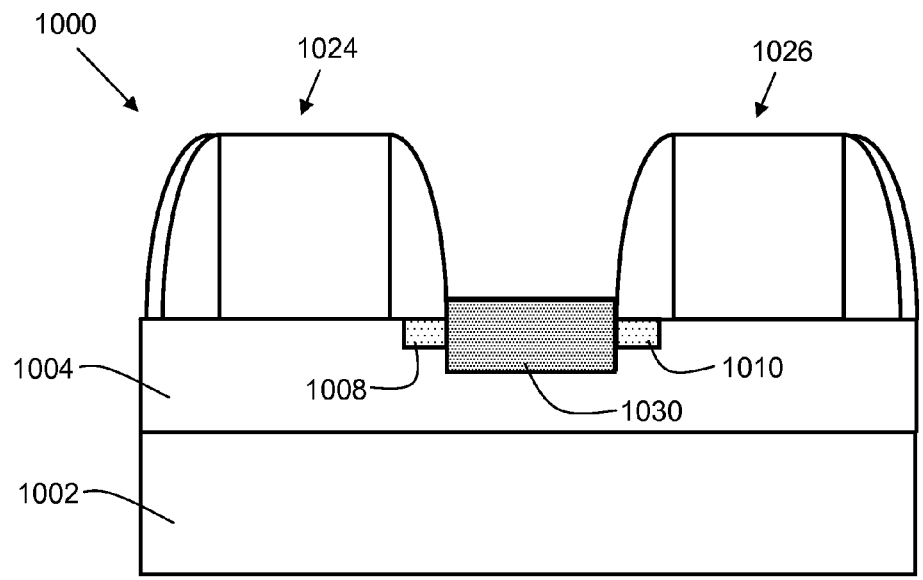
Figure 10C:
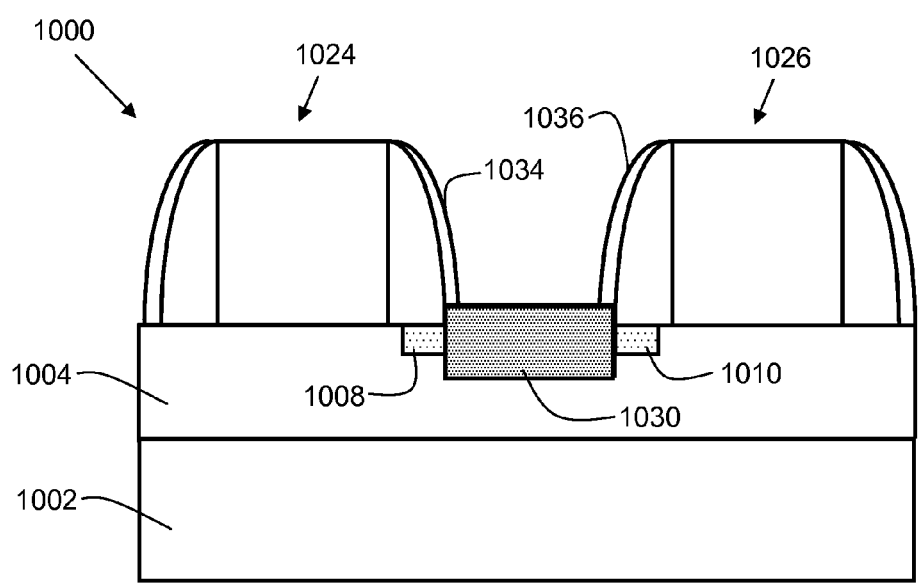

FIG. 10C shows the semiconductor structure of FIG. 10B after a process step of forming an additional set of spacers.

Figure 11:
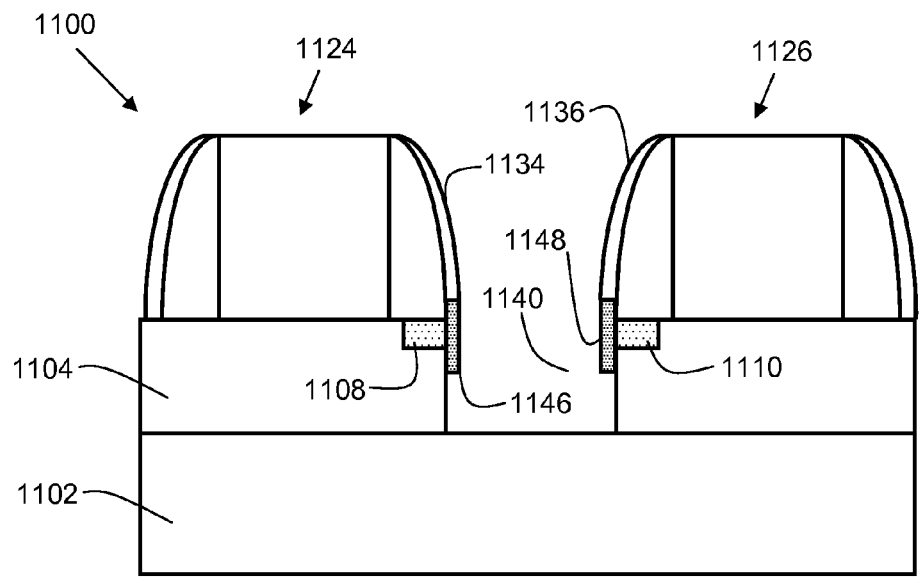

FIG. 11 shows the semiconductor structure of FIG. 10C after a process step of forming an opening in the buffer layer.

Figure 12:
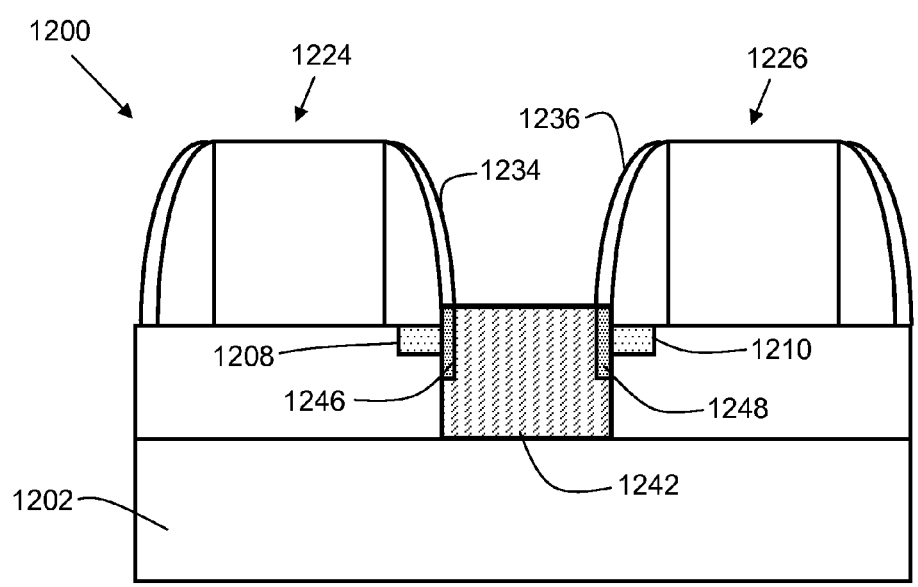

FIG. 12 shows the semiconductor structure of FIG. 11 after a process step of growing an epitaxial layer.

Figure 13:
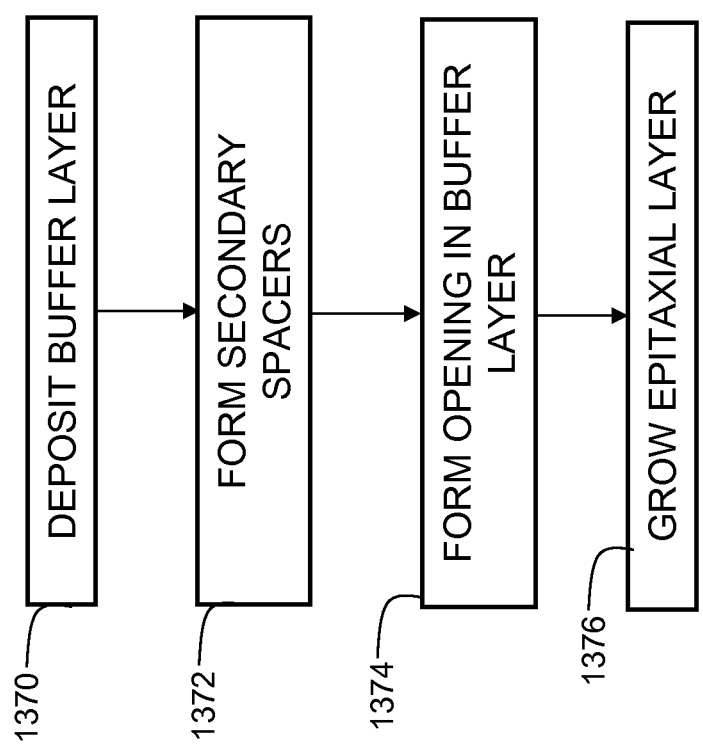

FIG. 13 is a flowchart indicating process steps for an embodiment of the present invention.

Figure 14:
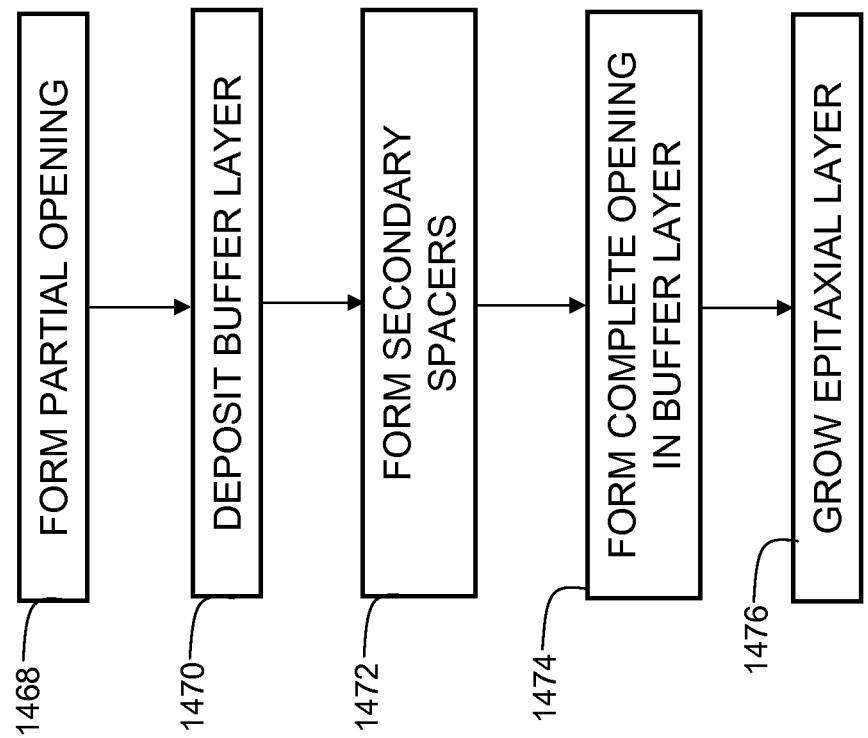

FIG. 14 is a flowchart indicating process steps for an alternative embodiment of the present invention.

Figure 15:
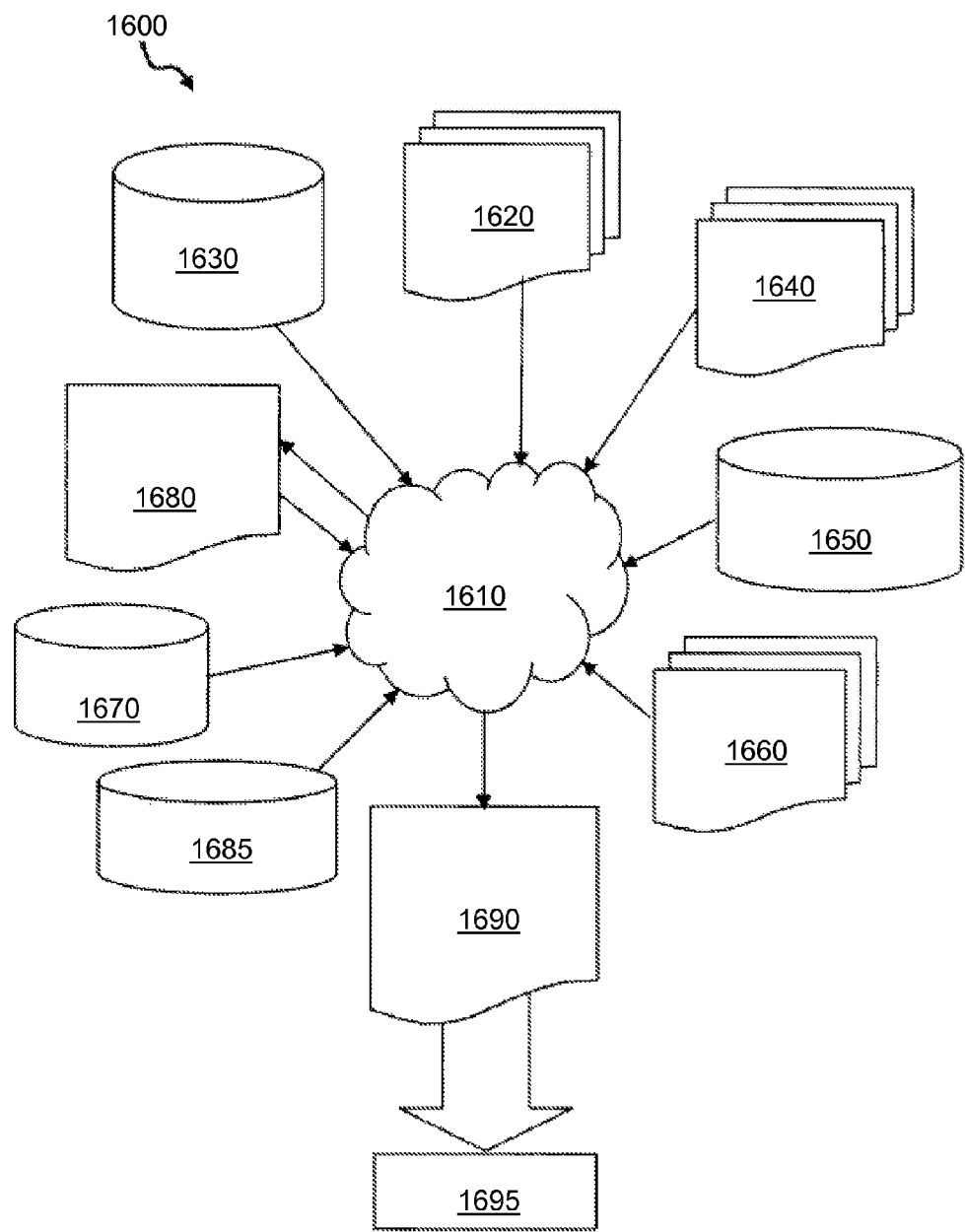

FIG. 15 shows a block diagram of an exemplary design flow.

DETAILED DESCRIPTION

Figure 1:
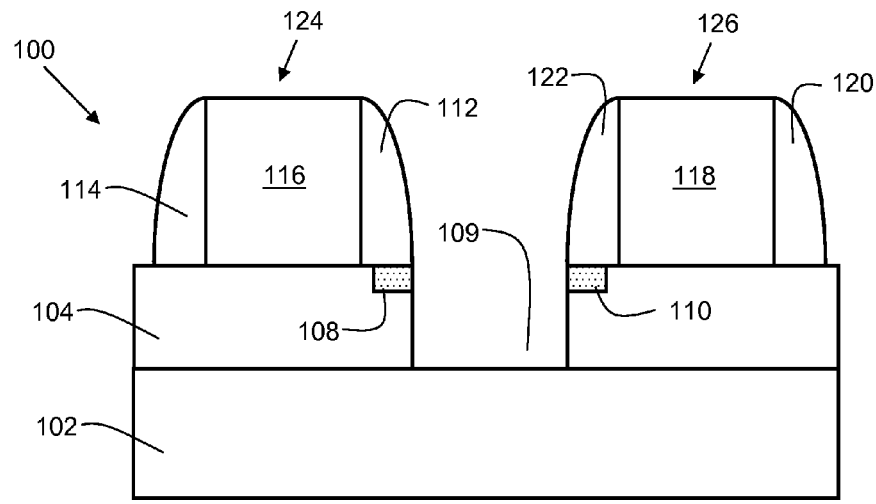

FIG. 1 shows a prior art semiconductor structure 100 at a starting point for embodiments of the present invention. Semiconductor structure 100 comprises two FET (field effect transistor) devices 124 and 126 disposed on a silicon substrate 104. Silicon substrate 104 is disposed on insulator layer 102. Insulator layer 102 may be a buried oxide (BOX) layer. FET 124 is comprised of gate 116 and adjacent primary spacers 112 and 114. FET 124 also comprises extension region 108, which is a highly doped region. FET 126 is comprised of gate 118 and adjacent primary spacers 120 and 122. FET 126 also comprises extension region 110, which is a highly doped region. Using epitaxial layers to induce stresses to improve FET performance is known. However, variations in the epitaxial layer can induce unwanted variability in the semiconductor devices. Therefore it is desirable to have a process that yields a more repeatable fabrication process with less variability. FET 124 and FET 126 are separated by opening 109.

Figure 2:
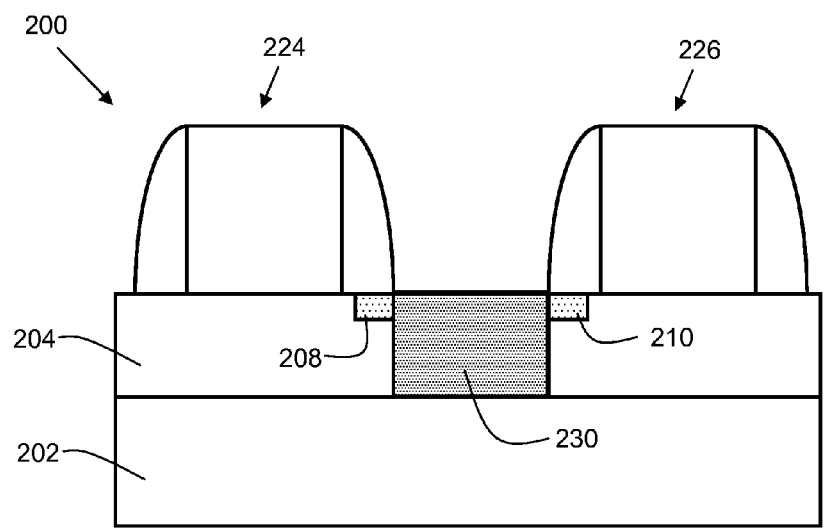

FIG. 2 shows a semiconductor structure 200 after a process step of depositing a buffer layer 230 in opening 109 (FIG. 1). As stated previously, like elements are often labeled with like reference numbers where the last two digits are similar. For example, insulator layer 202 of FIG. 2 is similar to insulator layer 102 of FIG. 1. Buffer layer 230 may be comprised of a silicon-phosphorous (SiP) material. Buffer layer 230 is conformal to the insulator layer 202 and silicon substrate 204. Buffer layer 230 may be grown in a non-cyclical manner. In other embodiments, buffer layer 230 may be comprised of SiAs or SiSb instead of SiP. Buffer layer 230 may be undoped or lightly doped.

Figure 3:
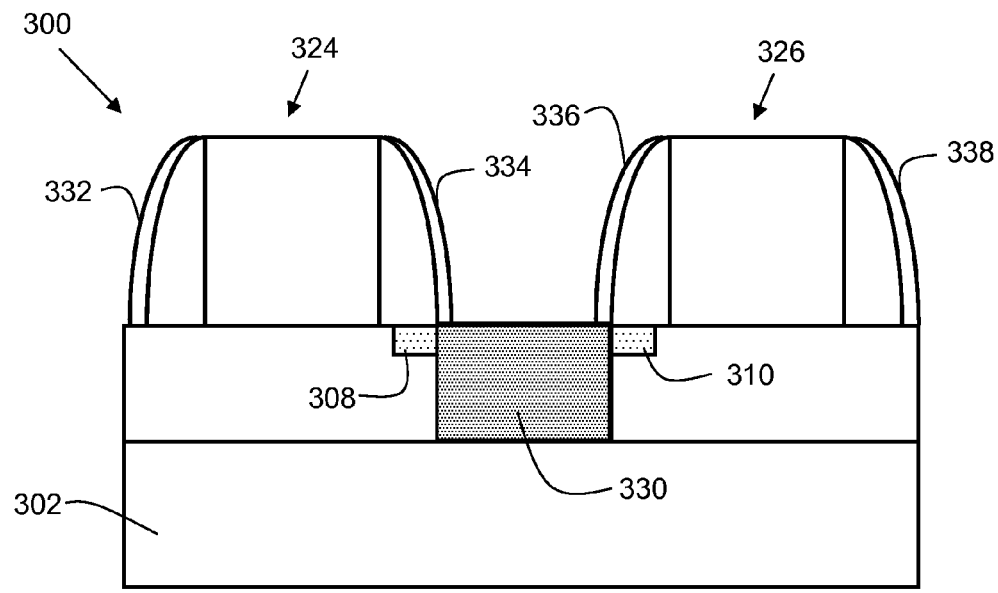

FIG. 3 shows a semiconductor structure 300 after a process step of forming secondary spacers, as indicated by 332, 334, 336 and 338. These spacers may be comprised of nitride, and are formed in a conventional manner. The secondary spacers 334 and 336 partially cover the buffer layer, and are used to control the thickness of the buffer layer on the sidewalls.

Figure 4:
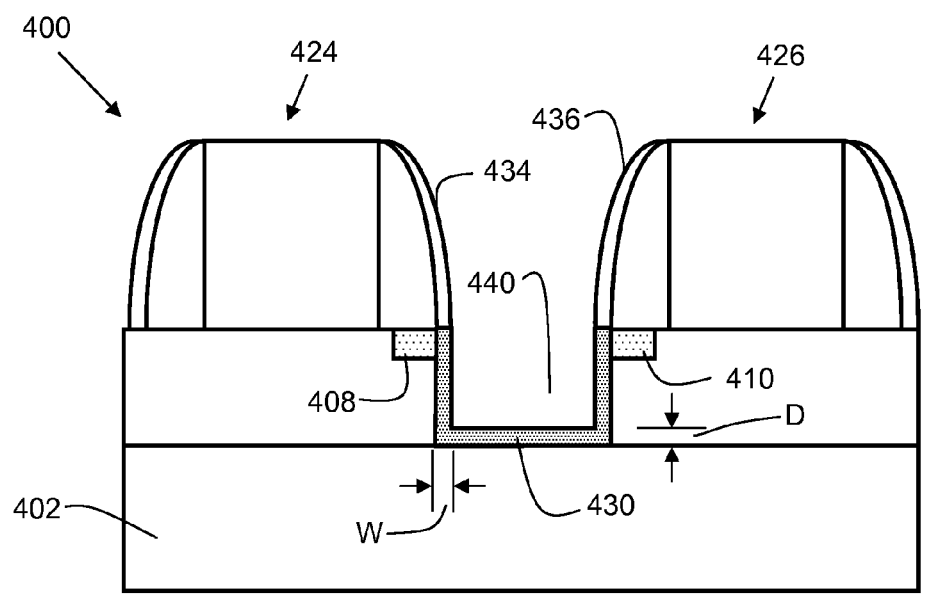

FIG. 4 shows a semiconductor structure 400 after a process step of forming an opening 440 in the buffer layer 430. This opening is formed with an anisotropic etch, such as a reactive ion etch (RIE). The resulting buffer layer 430 is of a uniform, controllable thickness. The sidewall thickness W is determined by the thickness of secondary spacers 434 and 436. The bottom depth D of the buffer layer 430 is determined by the anisotropic etch process. In one embodiment, the sidewall thickness W and bottom depth D are in the range of about 5 nanometers to about 10 nanometers.

Figure 5:
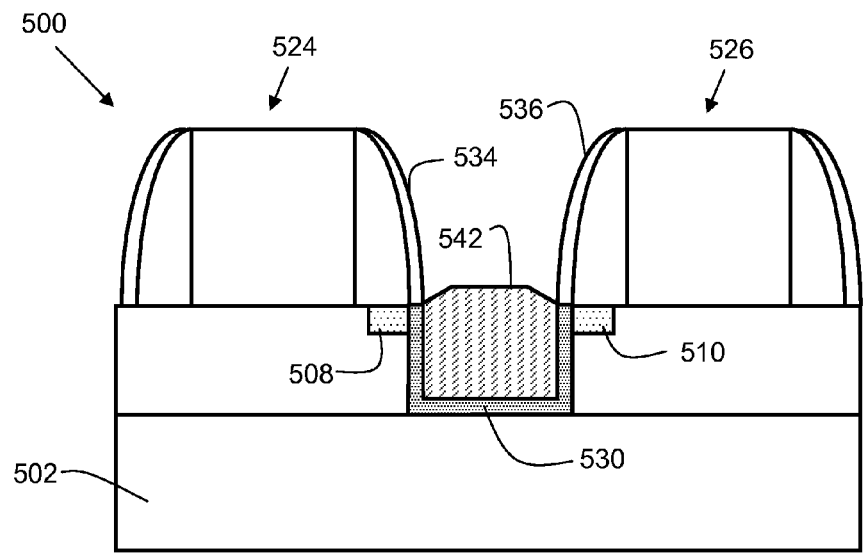

FIG. 5 shows a semiconductor structure 500 after a process step of growing an epitaxial layer 542. In one embodiment, epitaxial layer 542 may be comprised of a silicon-carbon-phosphorous (SiCP) material. In another embodiment, epitaxial layer 542 may be comprised of a silicon-germanium (SiGe) material. The epitaxial layer 542 may be a highly doped layer, with a dopant concentration ranging from about 1E20 atoms/cm3 to about 9E20 atoms/cm3. Epitaxial layer 542 may be grown in a cyclical manner, where it is grown and then etched back in small increments to reduce defects.

Other embodiments may include, but are not limited to, the following combinations of materials for the buffer layer and the epitaxial layer:

Embodiment A: The buffer layer is comprised of a low boron-doped (in the range of about 1-5E19 B atoms/cm3) SiGe film and the epitaxial layer is comprised of a high boron-doped (in the range of about 1E20-9E20 atoms/cm3) SiGe film.

Embodiment B: The buffer layer is comprised of undoped SiGe and the epitaxial layer is comprised of a high boron-doped (in the range of about 1E20-9E20 atoms/cm3) SiGe film.

Embodiment C: The buffer layer is comprised of undoped silicon-carbon (SiC) and the epitaxial layer is comprised of a high phosphorous-doped (in the range of about 1E20-9E20 atoms/cm3) SiC film.

Embodiment D: The buffer layer is comprised of a SiGe material with germanium content in the range of about 30 percent to about 60 percent. This film can grow defect free for about 5 to 10 nanometers, and the remainder of that film is sacrificial. The epitaxial layer is comprised of a high boron-doped (in the range of about 1E20-9E20 atoms/cm3) SiGe film.

Figure 6:
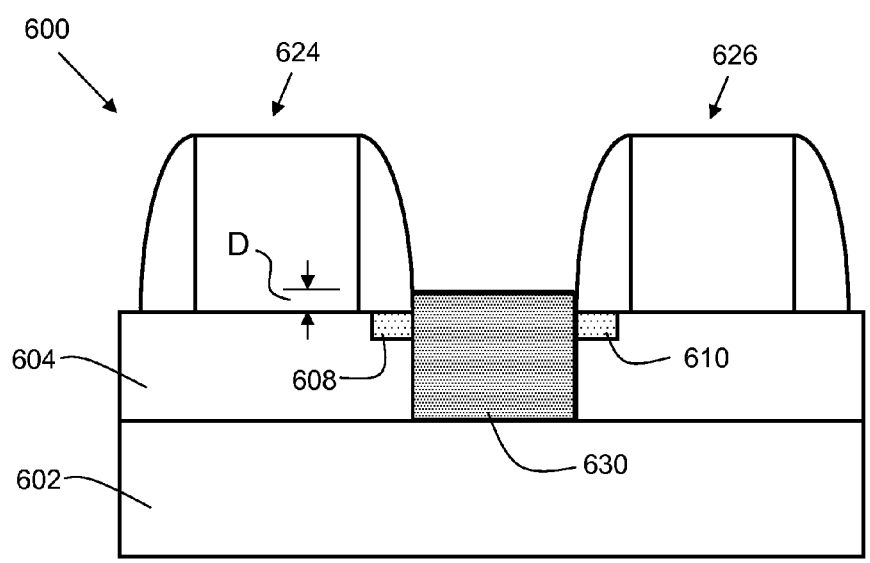

FIG. 6 shows a semiconductor structure 600 after a process step for another embodiment of the present invention, of depositing a buffer layer 630. In contrast with the embodiment described previously, in this embodiment, the top of buffer layer 630 is higher than the top of silicon layer 604 by distance D.

Figure 7:
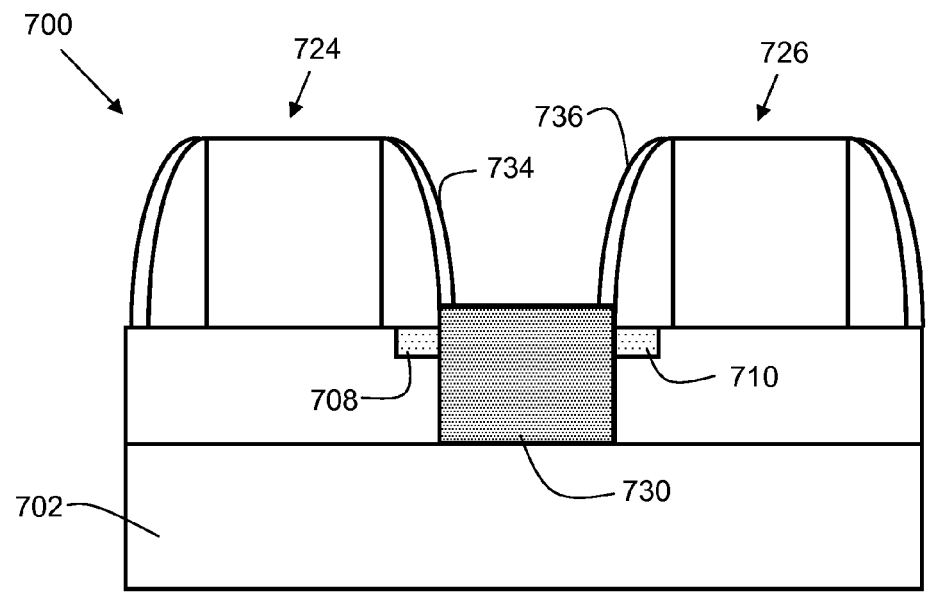

FIG. 7 shows a semiconductor structure 700, which is similar to that of FIG. 6, after a process step of forming an additional set of spacers 734 and 736.

Figure 8:
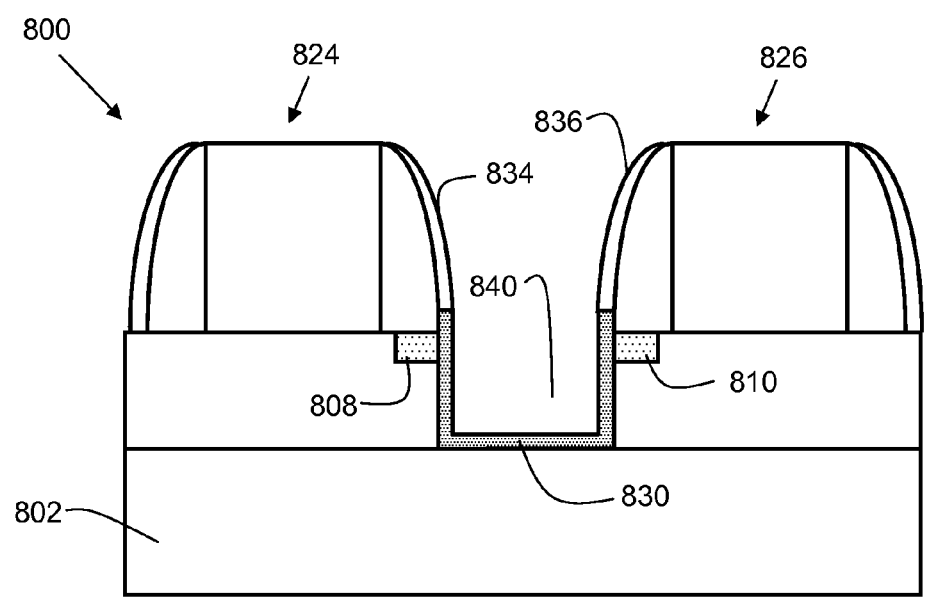

FIG. 8 shows a semiconductor structure 800, which is similar to that of FIG. 7, after a process step of forming an opening 840 in the buffer layer 830. Similar to the previously described embodiment, the opening 840 is formed with an anisotropic etch, such as a reactive ion etch (RIE). The resulting buffer layer 830 is of a uniform, controllable thickness. The sidewall thickness is determined by the thickness of secondary spacers 834 and 836.

Figure 9:
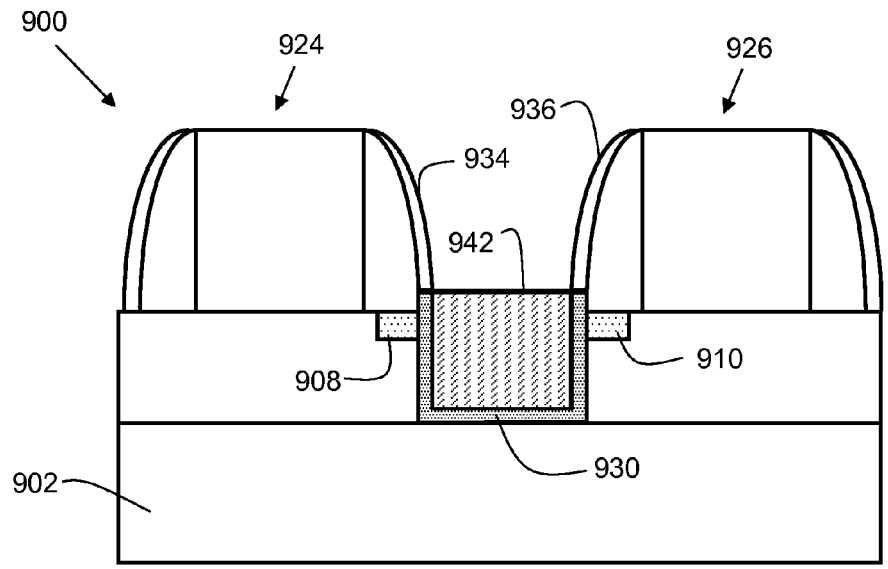

FIG. 9 shows a semiconductor structure 900, which is similar to that of FIG. 8, after a process step of growing an epitaxial layer 942. The morphology (shape) of the epitaxial layer 942 is generally flat on top, as compared with the "faceted" top of epitaxial layer 542 (FIG. 5) of the previous embodiment. The faceting of epitaxial layer 542 occurs because the epitaxial layer does not grow on spacers 534 and 536. However, to protect the extension regions 508 and 510, epitaxial layer 542 is intentionally overgrown. This causes the epitaxial layer to continue to grow in the middle, leading to the faceted shape. In the embodiment of FIG. 9, the buffer layer 930 extends above extension regions 934 and 935, and hence, overgrowth is not necessary, and a more even top of the epitaxial layer is produced. This "non-faceted" embodiment has advantages in downstream processing such as the introduction of silicide. In the case of a faceted epitaxial layer, silicide has more opportunity to corrupt the channel, whereas in the non-faceted embodiment, the uniform top of the epitaxial layer provides additional protection against silicide penetrating the channel of the transistor.

FIG. 10A shows a semiconductor structure 1000 after a process step for another embodiment of the present invention of forming an opening 1040 partially through a silicon layer. In one embodiment, the opening 1040 is approximately half of the depth of the silicon substrate 1004. For example, in one embodiment, silicon substrate 1004 is about 80 nanometers, and opening 1040 has a depth T of about 40 nanometers. FIG. 10B shows the semiconductor structure 1000 of FIG. 10A after a process step of depositing a buffer layer 1030 into the opening 1040 (FIG. 10A). FIG. 10C shows the semiconductor structure 1000 of FIG. 10B after a process step of forming an additional set of spacers 1134 and 1135.

FIG. 11 shows the semiconductor structure of FIG. 10C after a process step of forming an opening 1140 in the buffer layer. Opening 1140 traverses the buffer layer and the silicon substrate 1104, thereby forming buffer regions 1146 and 1148 that are disposed adjacent to extension regions 1108 and 1110 respectively.

FIG. 12 shows a semiconductor structure 1200, which is similar to that of FIG. 11 after a process step of growing an epitaxial layer 1242. The volume of epitaxial layer 1242 is increased as compared with that of the embodiment of FIG. 9 because in FIG. 12, the buffer layer is only the regions 1246 and 1248, as compared with buffer region 930 of FIG. 9, which bounds the entire sides and bottom of the opening. In the embodiment of FIG. 12, the epitaxial layer 1242 extends below and underneath the buffer regions, increasing the volume of the epitaxial layer 1242 in the areas where stress is beneficial, as compared with previously described embodiments. By increasing the volume of the epitaxial layer 1242, the performance-enhancing stresses can be increased, leading to improved semiconductor performance.

FIG. 13 is a flowchart indicating process steps for an embodiment of the present invention. In process step 1370, a buffer layer is deposited. This is shown in FIG. 2, where buffer layer 230 is deposited so that the top of buffer layer 230 is flush with the top of silicon substrate 204. Alternatively, process step 1370 may comprise depositing a buffer layer such as 630 of FIG. 6, in which case the top of buffer layer 630 extends above the top of silicon substrate 604. In process step 1372, secondary spacers are formed. The secondary spacers are shown in FIG. 3 as indicated by 332, 334, 336, and 338. In process step 1374, an opening is formed in the buffer layer. This is shown in FIG. 4 (see reference 440). In process step 1376, an epitaxial layer is grown. The epitaxial layer may be faceted, such as layer 542 of FIG. 5. Alternatively, the epitaxial layer may be non-faceted, such as layer 942 of FIG. 9.

FIG. 14 is a flowchart indicating process steps for an alternative embodiment of the present invention. In process step 1468, a partial opening is formed in the silicon layer. This is indicated by opening 1040 in FIG. 10A. In process step 1470, a buffer layer is deposited in the partial opening. This is shown as buffer layer 1030 in FIG. 10B. In process step 1472, secondary spacers are formed, as shown in FIG. 10C. In process step 1474 a complete opening is formed in the buffer layer. This is shown as opening 1140 in FIG. 11. In process step 1476, an epitaxial layer is grown, as shown in FIG. 12.

FIG. 15 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 2-14. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 2-14. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 2-14 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 2-14, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 2-14. Design structure 1690 may then proceed to a stage 1695 where, for example, design structure 1690: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure comprising two adjacent transistors on a silicon substrate, the method comprising:
    etching a first opening in the silicon substrate in the region between the two adjacent transistors;
    forming extension regions in the two adjacent transistors, depositing a buffer layer into the first opening;
    forming a set of spacers on the two adjacent transistors, such that the set of spacers partially covers the buffer layer;
    etching a second opening into the buffer layer, wherein the second opening traverses the buffer layer and the silicon substrate, and wherein a remaining portion of the buffer layer forms buffer regions disposed adjacent to the extension regions; and
    filling the second opening with an epitaxial layer, wherein the epitaxial layer extends below and underneath the buffer regions.

2. The method of claim 1, wherein depositing a buffer layer comprises depositing a layer of SiP.

3. The method of claim 1, wherein depositing a buffer layer comprises depositing a layer of SiSb.

4. The method of claim 1, wherein depositing a buffer layer comprises depositing a layer of SiAs.

5. The method of claim 1, wherein depositing a buffer layer comprises depositing a layer of SiC.

6. The method of claim 1, wherein depositing a buffer layer comprises depositing a layer of SiGe.

7. The method of claim 6, wherein depositing a layer of SiGe comprises depositing a layer of SiGe wherein the Ge content ranges from about 30 percent to about 60 percent.

8. The method of claim 1, further comprising, doping the epitaxial layer with a dopant concentration ranging from about 1E20 atoms/cm3 to about 9E20 atoms/cm3.

9. The method of claim 1, wherein etching a second opening into the buffer layer is performed with a reactive ion etch process.

10. The method of claim 1, wherein depositing a buffer layer into the first opening comprises depositing a buffer layer wherein the top of said buffer layer is higher than the top of the silicon substrate.

* * * * *